United States Patent
Nakaie et al.

(10) Patent No.: US 8,267,728 B2
(45) Date of Patent: Sep. 18, 2012

(54) RECEPTACLE, PRINTED WIRING BOARD, AND ELECTRONIC DEVICE

(75) Inventors: Toshiyuki Nakaie, Osaka (JP);
Hirotsugu Fusayasu, Kyoto (JP);
Shouichi Mimura, Osaka (JP);
Masafumi Kumoi, Osaka (JP); Ryo Matsubara, Osaka (JP)

(73) Assignee: Panasonic Corporation, Osaka (JP)

( * ) Notice: Subject to any disclaimer, the term of this patent is extended or adjusted under 35 U.S.C. 154(b) by 10 days.

(21) Appl. No.: 12/991,442

(22) PCT Filed: Apr. 8, 2010

(86) PCT No.: PCT/JP2010/002583
§ 371 (c)(1),
(2), (4) Date: Nov. 8, 2010

(87) PCT Pub. No.: WO2011/101922
PCT Pub. Date: Aug. 25, 2011

(65) Prior Publication Data
US 2011/0256739 A1    Oct. 20, 2011

(30) Foreign Application Priority Data
Feb. 18, 2010   (JP) .................... 2010-033987

(51) Int. Cl.
*H01R 24/00* (2011.01)
(52) U.S. Cl. .................................... 439/676
(58) Field of Classification Search ............ 439/55, 439/357–358, 607.01, 676, 79, 108, 76.1, 439/60
See application file for complete search history.

(56) References Cited

U.S. PATENT DOCUMENTS

| | | | |
|---|---|---|---|
| 5,496,180 A | | 3/1996 | Fabian et al. |
| 5,634,819 A | * | 6/1997 | Pan et al. ................. 439/637 |
| 6,186,836 B1 | | 2/2001 | Ezawa et al. |
| 6,264,500 B1 | | 7/2001 | Kawabe |
| 6,322,395 B1 | * | 11/2001 | Nishio et al. ............ 439/607.11 |
| 6,386,918 B1 | * | 5/2002 | Zheng et al. ............ 439/607.45 |
| 6,508,678 B1 | * | 1/2003 | Yang ......................... 439/677 |
| 6,561,850 B2 | | 5/2003 | Letourneau et al. |
| 6,612,876 B2 | * | 9/2003 | Hyland ...................... 439/676 |
| 6,840,806 B2 | * | 1/2005 | Kodama .................. 439/607.24 |
| 6,902,432 B2 | * | 6/2005 | Morikawa et al. ....... 439/607.41 |
| 7,442,051 B2 | | 10/2008 | Jiang et al. |
| 7,628,655 B1 | * | 12/2009 | Chen ......................... 439/660 |
| 2001/0024889 A1 | | 9/2001 | Koyama et al. |

(Continued)

FOREIGN PATENT DOCUMENTS

JP    H05-031172 U    4/1993

(Continued)

OTHER PUBLICATIONS

Notice of Allowance issued in co-pending U.S. Appl. No. 12/904,164.

(Continued)

*Primary Examiner* — Jean F Duverne
(74) *Attorney, Agent, or Firm* — Shinjyu Global IP

(57) ABSTRACT

A receptacle includes a signal terminal, a ground terminal, and a signal terminal. A second portion of the ground terminal is distanced from a first portion of the signal terminal in an extension direction. A third portion of the signal terminal is distanced from the first portion of the signal terminal in the extension direction.

11 Claims, 12 Drawing Sheets

U.S. PATENT DOCUMENTS

| | | |
|---|---|---|
| 2007/0000974 A1 | 1/2007 | Kubo |
| 2007/0035036 A1 | 2/2007 | Sota et al. |
| 2010/0015856 A1 | 1/2010 | Yamakami |
| 2011/0104915 A1 | 5/2011 | Lin et al. |

FOREIGN PATENT DOCUMENTS

| | | | |
|---|---|---|---|
| JP | 2741865 B | | 4/1998 |
| JP | H10-270125 A | | 10/1998 |
| JP | 2000-021474 A | | 1/2000 |
| JP | 2001-266979 A | | 9/2001 |
| JP | 3333457 B | | 10/2002 |
| JP | 2007-012899 A | | 1/2007 |
| JP | 2007-53121 A | | 3/2007 |
| JP | 2007-115707 A | | 5/2007 |
| JP | 2009-009728 A | | 1/2009 |
| JP | 2010-027354 A | | 2/2010 |
| JP | 2010-537384 A | | 12/2010 |

OTHER PUBLICATIONS

Matsubara, et al., "Receptacle Structure, Printed Wiring Board Structure, and Electronic Device" filed Jul. 16, 2010, U.S. Appl. No. 12/837,517.

Matsubara, et al., "Receptacle, Printed Wiring Board, and Electronic Device" filed Oct. 7, 2010, U.S. Appl. No. 12/936,907.

Mimura et al., "Receptacle and Electronic Device" filed Oct. 14, 2010, U.S. Appl. No. 12/904,164.

Office Action (mailed Oct. 6, 2011) issued in co-pending U.S. Appl. No. 12/837,517.

Notice of Allowance issued in related Japanese Patent Application No. 2010-033996, dated May 22, 2012.

\* cited by examiner

RECEPTACLE, PRINTED WIRING BOARD, AND ELECTRONIC DEVICE

CROSS-REFERENCE TO RELATED APPLICATIONS

This application claims priority under 35 U.S.C. §119 to Japanese Patent Application No. 2010-033987 filed on Feb. 18, 2010. The entire disclosure of Japanese Patent Application No. 2010-033987 is hereby incorporated herein by reference.

TECHNICAL FIELD

The present invention relates to a receptacle, a printed wiring board, and to a electronic device including the receptacle and the printed wiring board.

BACKGROUND INFORMATION

Techniques in which digital signals are transmitted at high speeds between electronic devices (for example, Audio-Visual devices, mobile terminals, and so on) via interfaces based on standards such as HDMI (High-Definition Multimedia Interface)®, USB (Universal Serial Bus), and so on have come into wide use in recent years.

Such interfaces are configured of a receptacle mounted on a mounting face of a printed wiring board and a plug that is inserted into the receptacle.

The receptacle includes a terminal insulating board that fits into the plug, multiple bottom terminals, and multiple top terminals. The terminal insulating board has a bottom face provided on the side toward the printed wiring board and a top face provided on the opposite side of the bottom face. Each of the bottom terminals is connected to the bottom face of the terminal insulating board and the printed wiring board. Each of the top terminals, meanwhile, is connected to the top face of the terminal insulating board and the printed wiring board.

The printed wiring board includes multiple forward-row lands, multiple rear-row lands, and wires formed on the mounting face. Each of the top terminals is connected to a respective forward-row land. Each of the bottom terminals, meanwhile, is connected to a respective rear-row land. The wires extend toward the inside of the mounting face from the forward-row lands and the rear-row lands.

Here, in order to simplify the terminal structure, it is common for the multiple top terminals to be adjacent to each other and to be connected to the printed wiring board at a location that is further from the terminal insulating board than the multiple bottom terminals (for example, see JP2009-9728A). Accordingly, the multiple forward-row lands are provided adjacent to each other at a location that is further from the terminal insulating board than the multiple rear-row lands.

SUMMARY

However, to reduce the surface area of the wires on the mounting face, it is necessary to pass the wire that extends from a single rear-row land between two adjacent forward-row lands. For this reason, it is necessary to employ a printed wiring board in which fine wiring patterns can be formed at high densities, which is problematic in that it leads to an increase in the cost of manufacturing the printed wiring board.

Having been conceived in light of the aforementioned problem, it is an object of the present invention to provide a receptacle, a printed wiring board, and an electronic device capable of suppressing an increase in the cost of manufacturing the printed wiring board.

A receptacle according to an aspect of the present invention is a receptacle that is mounted on a printed wiring board and into which a plug is inserted, and includes: a housing configured to be mounted on a printed wiring board, including an opening into which the plug is inserted; a terminal insulating board including a top face and a bottom face opposite the top face, the terminal insulating board being disposed inside the housing with the bottom face facing the printed wiring board; a first top terminal including a first top face connection portion connected to the top face and a first portion connected to the printed wiring board, the first top terminal being disposed along a predetermined direction when viewed from above the top face; a second top terminal including a second top face connection portion connected to the top face at a little distance from the first top face connection portion and a second portion connected to the printed wiring board at a distance from the first portion in the predetermined direction; and a bottom terminal including a bottom face connection portion connected to the bottom face on the opposite side of the first top face connection portion and the second top face connection portion and a third portion connected to the printed wiring board at a distance from the first portion in the predetermined direction.

A printed wiring board according to an aspect of the present invention is a printed wiring board onto which a receptacle is mounted, and includes: a main substrate having a mounting face configured to support the receptacle; a first land disposed on the mounting face along a predetermined direction; a second land disposed on the mounting face at a distance from the first land in the predetermined direction; and a third land disposed on the mounting face at a distance from the first land in the predetermined direction and located between the first land and the second land in a perpendicular direction.

An electronic device according to an aspect of the present invention includes a receptacle into which a plug is inserted and a printed wiring board onto which the receptacle is mounted. The receptacle has: a housing configured to be mounted on a printed wiring board, including an opening into which the plug is inserted; a terminal insulating board including a top face and a bottom face opposite the top face, the terminal insulating board being disposed inside the housing with the bottom face facing the printed wiring board; a first top terminal including a first top face connection portion connected to the top face and a first portion connected to the printed wiring board, the first top terminal being disposed along a predetermined direction when viewed from above the top face; a second top terminal including a second top face connection portion connected to the top face at a little distance from the first top face connection portion and a second portion connected to the printed wiring board at a distance from the first portion in the predetermined direction; and a bottom terminal including a bottom face connection portion connected to the bottom face on the opposite side of the first top face connection portion and the second top face connection portion and a third portion connected to the printed wiring board at a distance from the first portion in the predetermined direction. The printed wiring board has: a main substrate having a mounting face configured to support the receptacle; a first land disposed on the mounting face and that is connected to the first portion; a second land disposed on the mounting face and that is connected to the second portion; and a third land that disposed on the mounting face and that is connected to the third portion.

According to the present invention, it is possible to provide a receptacle, a printed wiring board, and an electronic device capable of suppressing an increase in the cost of manufacturing the printed wiring board.

DETAILED DESCRIPTION OF THE EMBODIMENTS

Figure 1:
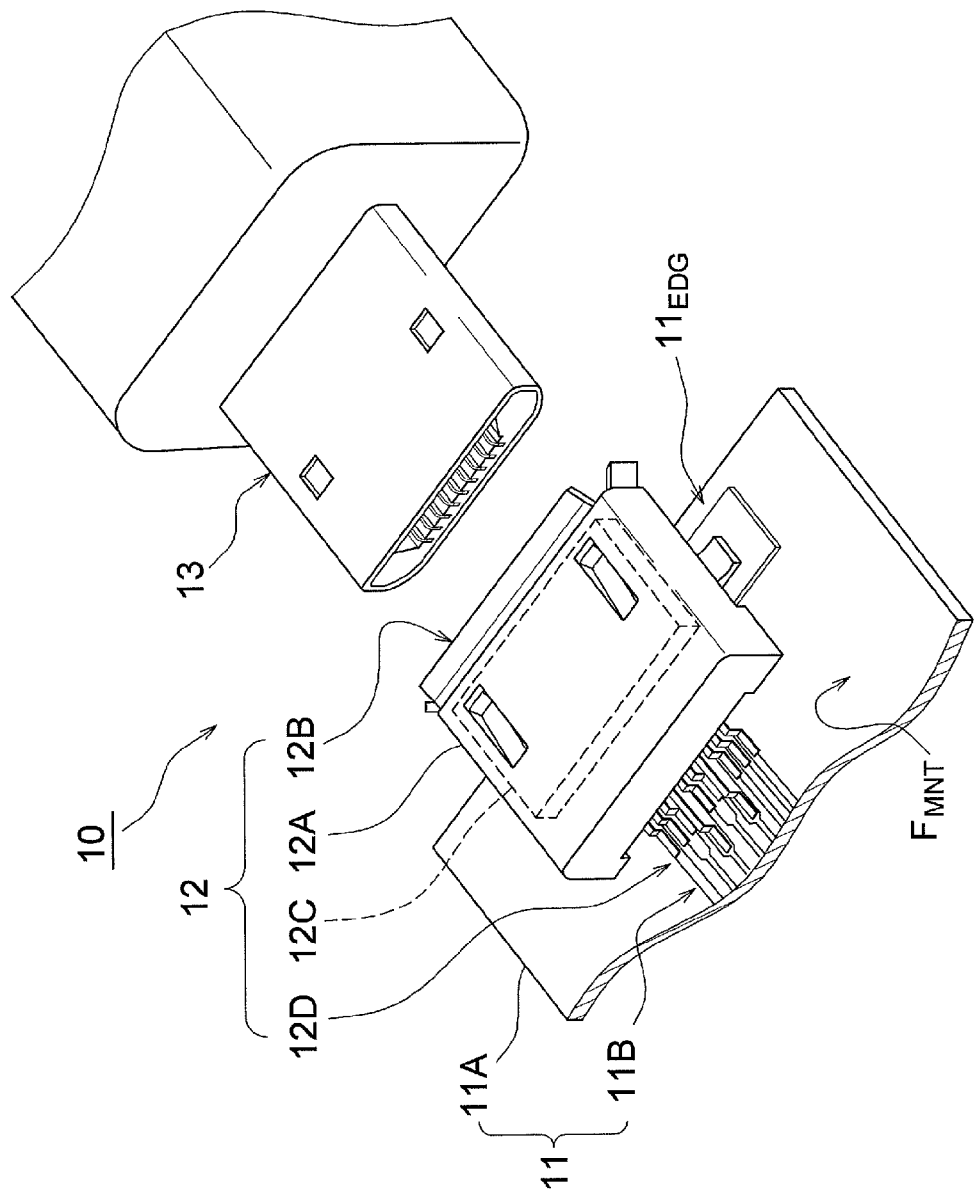
FIG. 1 is a perspective view illustrating the configuration of an interface 10 according to a first embodiment.

Next, embodiments of the present invention will be described using the drawings. In the following descriptions of the drawings, identical or similar elements will be given identical or similar reference numerals. However, the drawings are schematic in nature and thus there are cases where the illustrated ratios of dimensions and so on differ from the actual ratios. As such, the specific dimensions should be judged in consideration of the following descriptions. Furthermore, it goes without saying that the drawings include elements whose dimensional relationships, ratios, and so on differ from drawing to drawing.

First Embodiment (Interface Configuration)

The configuration of an interface according to a first embodiment will be described with reference to the drawings. The present embodiment will describe an interface 10, based on the HDMI (High-Definition Multimedia Interface)® standard, as an example of an interface between electronic devices. Note that "electronic device" refers to, for example, an Audio-Visual device, a mobile terminal, a personal computer, or the like.

FIG. 1 is a perspective view illustrating the configuration of the interface 10 according to the first embodiment. As shown in FIG. 1, the interface 10 is configured of a printed wiring board 11, a receptacle 12, and a plug 13.

The printed wiring board 11 is installed within a first electronic device (not shown). The printed wiring board 11 includes a main substrate 11A and a wire group 11B. The main substrate 11A has a mounting face $F_{MNT}$. The configuration of the printed wiring board 11 will be described later.

The receptacle 12 is mounted upon the mounting face $F_{MNT}$ at an edge portion $11_{EDG}$ of the printed wiring board 11. The receptacle 12 includes a housing 12A, an opening 12B, a terminal insulating board 12C, and a terminal group 12D. The configuration of the receptacle 12 will be described later.

The plug 13 is provided in a second electronic device (not shown). The plug 13 is electrically connected to the receptacle 12 by inserting the plug 13 into the opening 12B. The plug 13 transmits digital signals between the first electronic device and the second electronic device.

(Receptacle Configuration)

Figure 2:
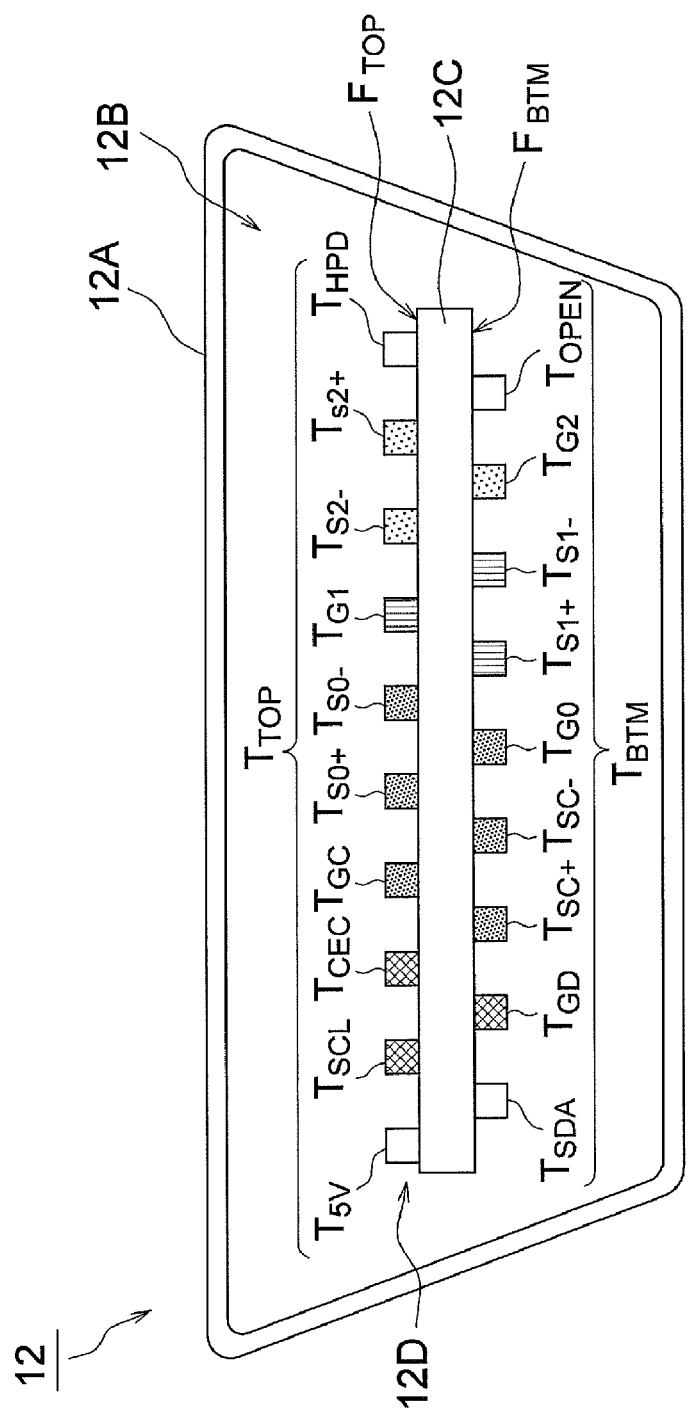
FIG. 2 is a plan view illustrating a receptacle 12 according to the first embodiment as viewed from an opening 12B.
Figure 3:
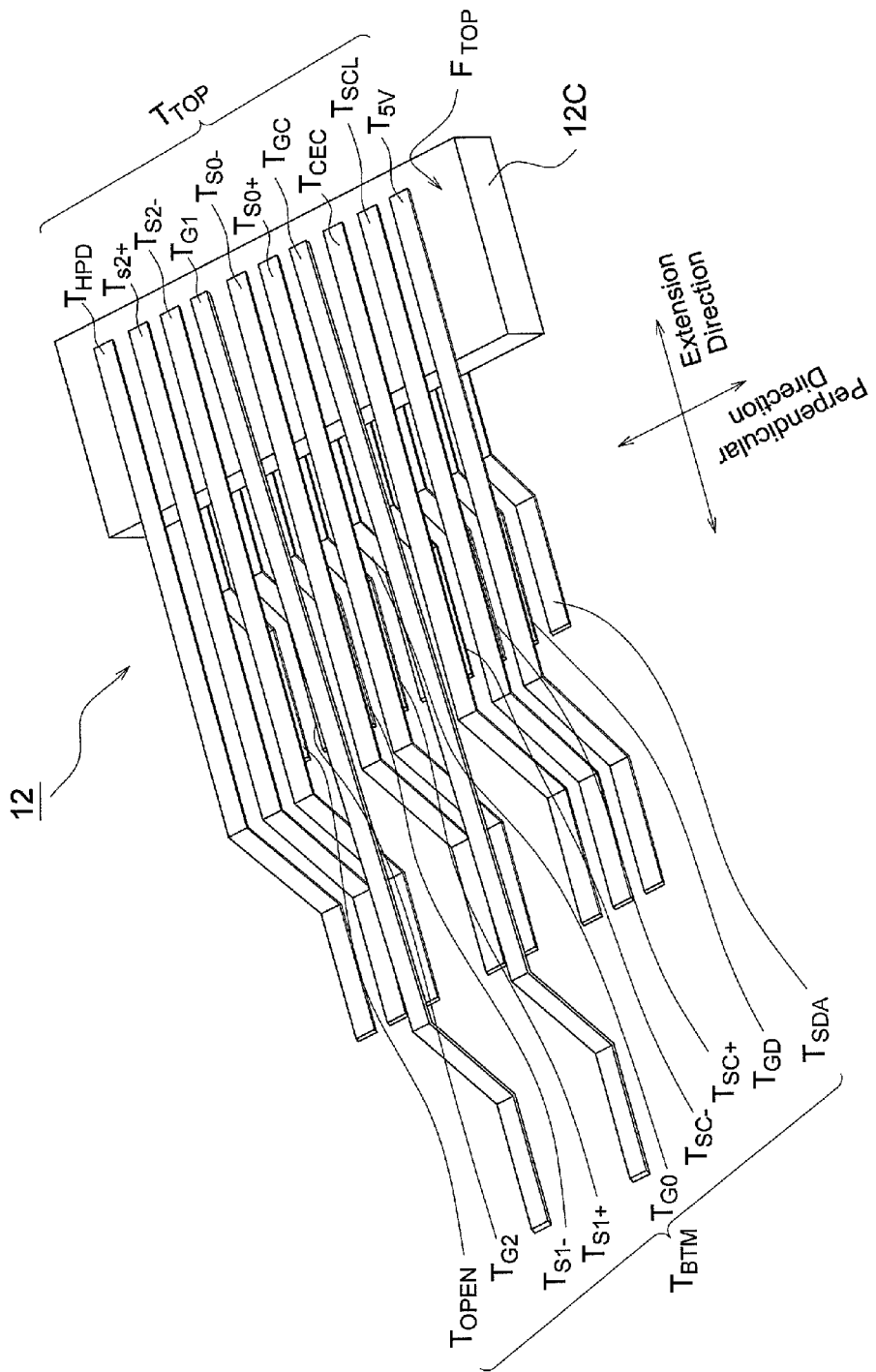
FIG. 3 is a perspective view illustrating the internal configuration of the receptacle 12 according to the first embodiment.

Next, the configuration of the receptacle according to the first embodiment will be described with reference to the drawings. FIG. 2 is a plan view illustrating the receptacle 12 according to the first embodiment as viewed from the opening 12B. FIG. 3 is a perspective view illustrating the internal configuration of the receptacle 12 according to the first embodiment. Note that the housing 12A has been omitted from FIG. 3.

As shown in FIGS. 2 and 3, the receptacle 12 includes the housing 12A, the opening 12B, the terminal insulating board 12C, and the terminal group 12D.

The housing 12A is a container that houses the terminal insulating board 12C and the terminal group 12D.

The opening 12B is formed in the housing 12A. The plug 13 is inserted into the opening 12B. Although not shown in the drawings, the opening 12B is exposed through the housing of the first electronic device.

The terminal insulating board 12C is a plate-shaped substrate provided within the housing 12A. The terminal insulating board 12C is fitted into the plug 13. The terminal insulating board 12C has, as shown in FIGS. 2 and 3, a bottom face $F_{BTM}$ and a top face $F_{TOP}$. The bottom face $F_{BTM}$ is provided on the side toward the mounting face $F_{MNT}$. The top face $F_{TOP}$, meanwhile, is provided on the opposite side of the bottom face $F_{BTM}$.

The terminal group 12D is connected to the terminal insulating board 12C and the printed wiring board 11 (and to be more specific, to the wire group 11B). The terminal group 12D transmits digital signals between the printed wiring board 11 and the plug 13. The terminal group 12D has multiple bottom terminals $T_{BTM}$ and multiple top terminals $T_{TOP}$. The bottom terminals $T_{BTM}$ are, as shown in FIG. 2, disposed in an alternating fashion with respect to the top terminals $T_{TOP}$.

The multiple bottom terminals $T_{BTM}$ include an open terminal $T_{OPEN}$, a ground terminal $T_{G2}$, a pair of signal terminals $T_{S1+}$ and $T_{S1-}$, a ground terminal $T_{G0}$, a pair of signal terminals $T_{SC+}$ and $T_{SC-}$, a ground terminal $T_{GD}$, and an SDA terminal $T_{SDA}$. Each of the bottom terminals $T_{BTM}$ is connected to the bottom face $F_{BTM}$ of the terminal insulating board 12C and the printed wiring board 11.

As shown in FIG. 3, the bottom terminals $T_{BTM}$ are provided following the direction in which the plug 13 is inserted into the opening 12B (called an "extension direction" hereinafter). The bottom terminals $T_{BTM}$ are adjacent to each other in the direction perpendicular to the extension direction (called the "perpendicular direction" hereinafter). The bottom terminals $T_{BTM}$ are configured of a plate-shaped metal material that has undergone a bending process.

The multiple top terminals $T_{TOP}$ include an HPD signal terminal $T_{HPD}$, a pair of signal terminals $T_{S2+}$ and $T_{S2-}$, a ground terminal $T_{G1}$, a pair of signal terminals $T_{S0+}$ and $T_{S0-}$, a ground terminal $T_{GC}$, a CEC terminal $T_{CEC}$, an SCL terminal $T_{SCL}$, and a power source terminal $T_{5V}$. Each of the top terminals $T_{TOP}$, meanwhile, is connected to the top face $F_{TOP}$ of the terminal insulating board 12C and the printed wiring board 11.

As shown in FIG. 3, the top terminals $T_{TOP}$ are provided following the extension direction. The top terminals $T_{TOP}$ are adjacent to each other in the perpendicular direction. The top terminals $T_{TOP}$ are configured of a plate-shaped metal material that has undergone a bending process.

Here, in the present embodiment, the ground terminal $T_{G1}$ and the ground terminal $T_{GC}$ are formed so as to be longer in the extension direction than the other top terminals $T_{TOP}$. The configurations of the ground terminal $T_{G1}$ and the ground terminal $T_{GC}$ will be described later.

Note that the signal terminals $T_S$ transmit digital signals according to a quasi-differential transmission system such as TMDS (Transition Minimized Differential Signaling) and so on. As such, the phase of the digital signal transmitted by the signal terminal $T_{S1+}$ is inverted relative to the phase of the signal transmitted by the signal terminal $T_{S1-}$.

Meanwhile, the ground terminals $T_G$ ground corresponding signal terminals $T_S$. For example, the ground terminal $T_{G1}$ grounds the pair of signal terminals $T_{S1+}$ and $T_{S1-}$.

(Printed Wiring Board Configuration)

Figure 4:
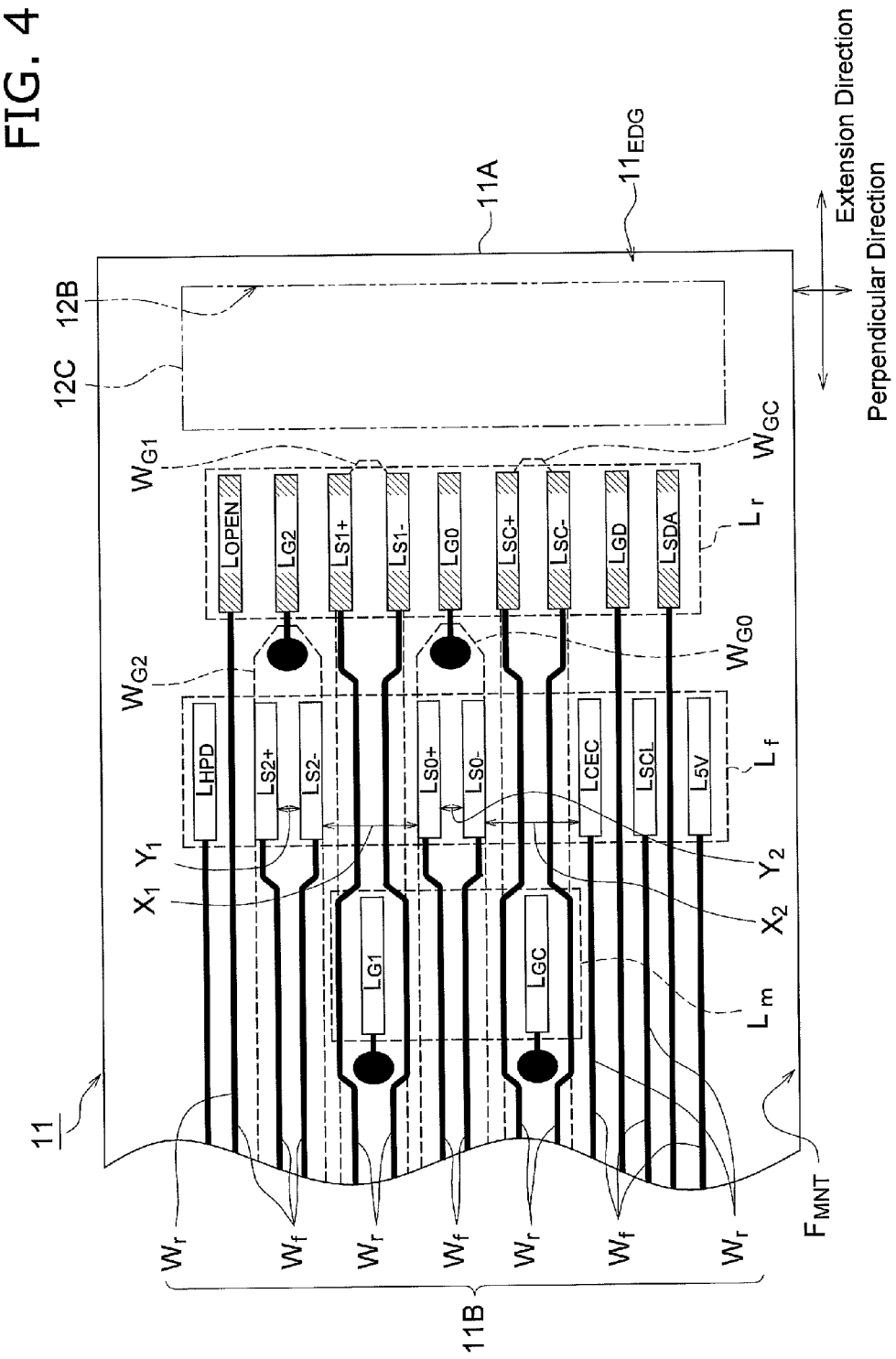
FIG. 4 is a plan view illustrating a printed wiring board 11 according to the first embodiment as viewed from a mounting face $F_{MNT}$.

Next, the configuration of the printed wiring board according to the first embodiment will be described with reference to the drawings. FIG. 4 is a plan view illustrating the printed wiring board 11 according to the first embodiment as viewed from the mounting face $F_{MNT}$. Note that in FIG. 4, the opening 12B and the terminal insulating board 12C of the receptacle 12 are indicated by the double-dot-dash lines.

The printed wiring board 11 includes the main substrate 11A and the wire group 11B.

The main substrate 11A is a multilayer board having the mounting face $F_{MNT}$. The receptacle 12, various components (not shown), and so on are mounted on the mounting face $F_{MNT}$.

The wire group 11B electrically connects the receptacle 12 and the various components. The wire group 11B transmits digital signals between the receptacle 12 and the various components. The wire group 11B includes multiple rear-row lands Lr, multiple forward-row lands Lf, multiple forwardmost-row lands Lm, multiple rearward wires Wr, multiple forward wires Wf, and multiple ground wires $W_G$.

The multiple rear-row lands Lr are metal members for connecting the multiple bottom terminals $T_{BTM}$. As shown in FIG. 4, the multiple rear-row lands Lr include four signal terminal lands $L_S$. The four signal terminal lands $L_S$ include a pair of signal terminal lands $L_{S1+}$ and $L_{S1-}$ corresponding to the pair of signal terminals $T_{S1+}$ and $T_{S1-}$ and a pair of signal terminal lands $L_{SC+}$ and $L_{SC-}$ corresponding to the pair of signal terminals $T_{SC+}$ and $T_{SC-}$.

The multiple forward-row lands Lf are metal members for connecting the multiple top terminals $T_{TOP}$ (excluding the ground terminal $T_{G1}$ and the ground terminal $T_{GC}$). The multiple forward-row lands Lf are, as shown in FIG. 4, further from the edge portion $11_{EDG}$ of the main substrate 11A in the extension direction than the multiple rear-row lands Lr. To rephrase, the multiple forward-row lands Lf are further from the opening 12B of the receptacle 12 than the multiple rear-row lands Lr when viewed from above the mounting face $F_{MNT}$.

Here, an interval $X_1$ between the signal terminal land $L_{S2-}$ and the signal terminal land $L_{S0+}$ is greater than an interval $Y_1$ between the pair of signal terminal lands $L_{S2+}$ and $L_{S2-}$.

Likewise, an interval $X_2$ between the signal terminal land $L_{S0-}$ and a CEC terminal land $L_{CEC}$ is greater than an interval $Y_2$ between the pair of signal terminal lands $L_{S0+}$ and $L_{S0-}$.

The multiple forwardmost-row lands Lm are metal members for connecting the ground terminal $T_{G1}$ and the ground terminal $T_{GC}$ of the multiple top terminals $T_{TOP}$. The multiple forwardmost-row lands Lm include a ground terminal land $L_{G1}$ and a ground terminal land $L_{GC}$. The multiple forwardmost-row lands Lm are, as shown in FIG. 4, further from the edge portion $11_{EDG}$ of the main substrate 11A in the extension direction than the multiple forward-row lands Lf. In other words, the multiple forwardmost-row lands Lm are further from the opening 12B of the receptacle 12 than the multiple forward-row lands Lf when viewed from above the mounting face $F_{MNT}$.

The multiple rearward wires Wr are connected to the multiple rear-row lands Lr. Although not shown in the drawings, the rearward wires Wr are connected to the various components that are mounted. Each of the rearward wires Wr is disposed between two forward-row lands Lf.

The multiple forward wires Wf are connected to the multiple forward-row lands Lf. Although not shown in the drawings, the forward wires Wf are connected to the various components that are mounted. The forward wires Wf are disposed facing toward the inside of the mounting face $F_{MNT}$ from the forward-row lands Lf.

The multiple ground wires $W_G$ are connected to four ground terminal lands $L_G$ through via wires. Specifically, the multiple ground wires $W_G$ include a ground wire $W_{G2}$ connected to a ground terminal land $L_{G2}$, a ground wire $W_{G1}$ connected to the ground terminal land $L_{G1}$, a ground wire $W_{G0}$ connected to a ground terminal land $L_{G0}$, and a ground wire $W_{G2C}$ connected to the ground terminal land $L_{GC}$.

The ground wire $W_{G2}$ grounds the forward wires Wf extending from the pair of signal terminal lands $L_{S2+}$ and $L_{S2-}$. The ground wire $W_{G1}$ grounds the rearward wires Wr extending from the pair of signal terminal lands $L_{S1+}$ and $L_{S1-}$. The ground wire $W_{G0}$ grounds the forward wires Wf extending from the pair of signal terminal lands $L_{S0+}$ and $L_{S0-}$. The ground wire $W_{GC}$ grounds the rearward wires Wr extending from the pair of signal terminal lands $L_{SC+}$ and $L_{SC-}$.

(Terminal, Land, and Wire Configuration)

Figure 5:
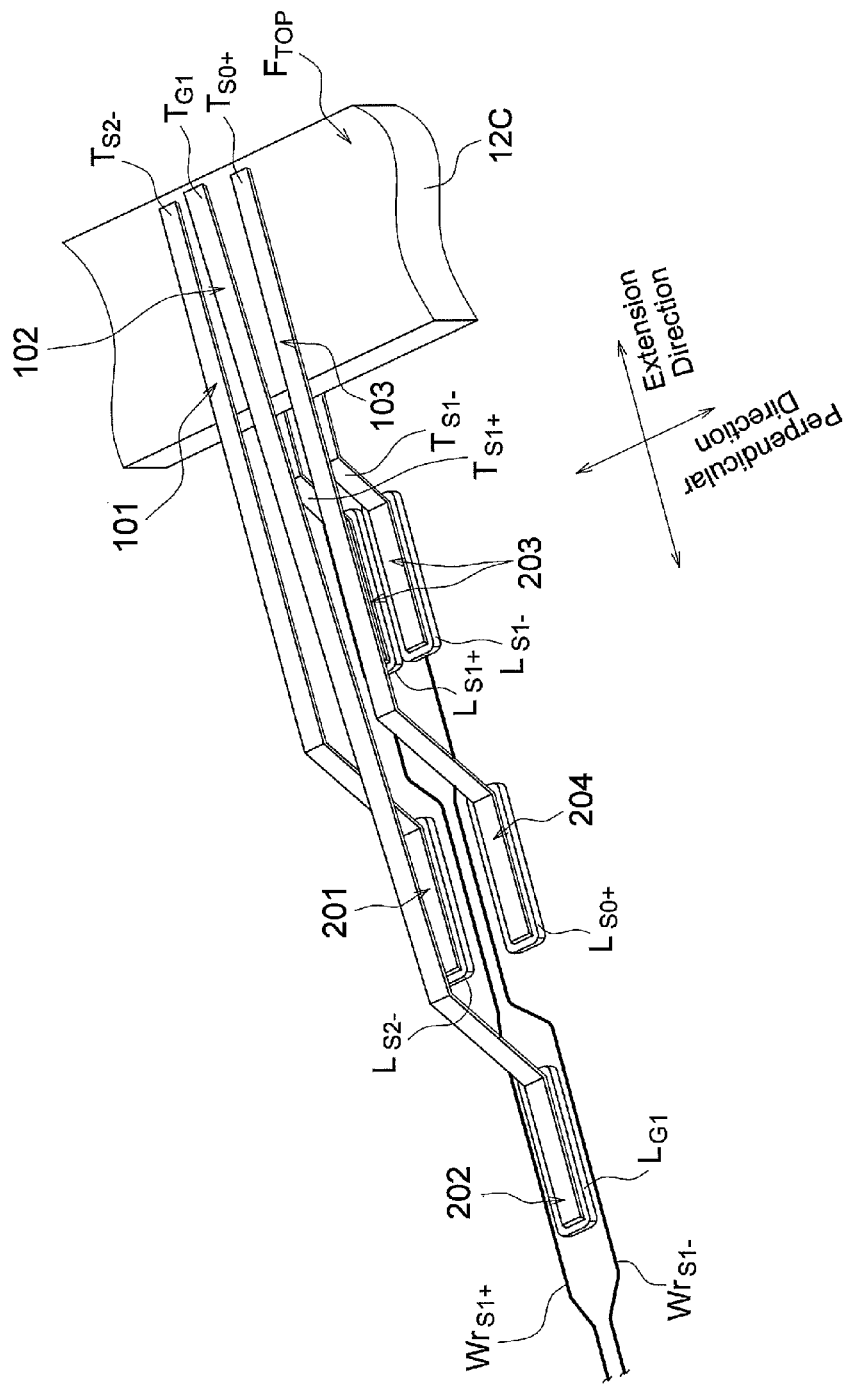
FIG. 5 is an enlarged perspective view of FIG. 3.
Figure 6:
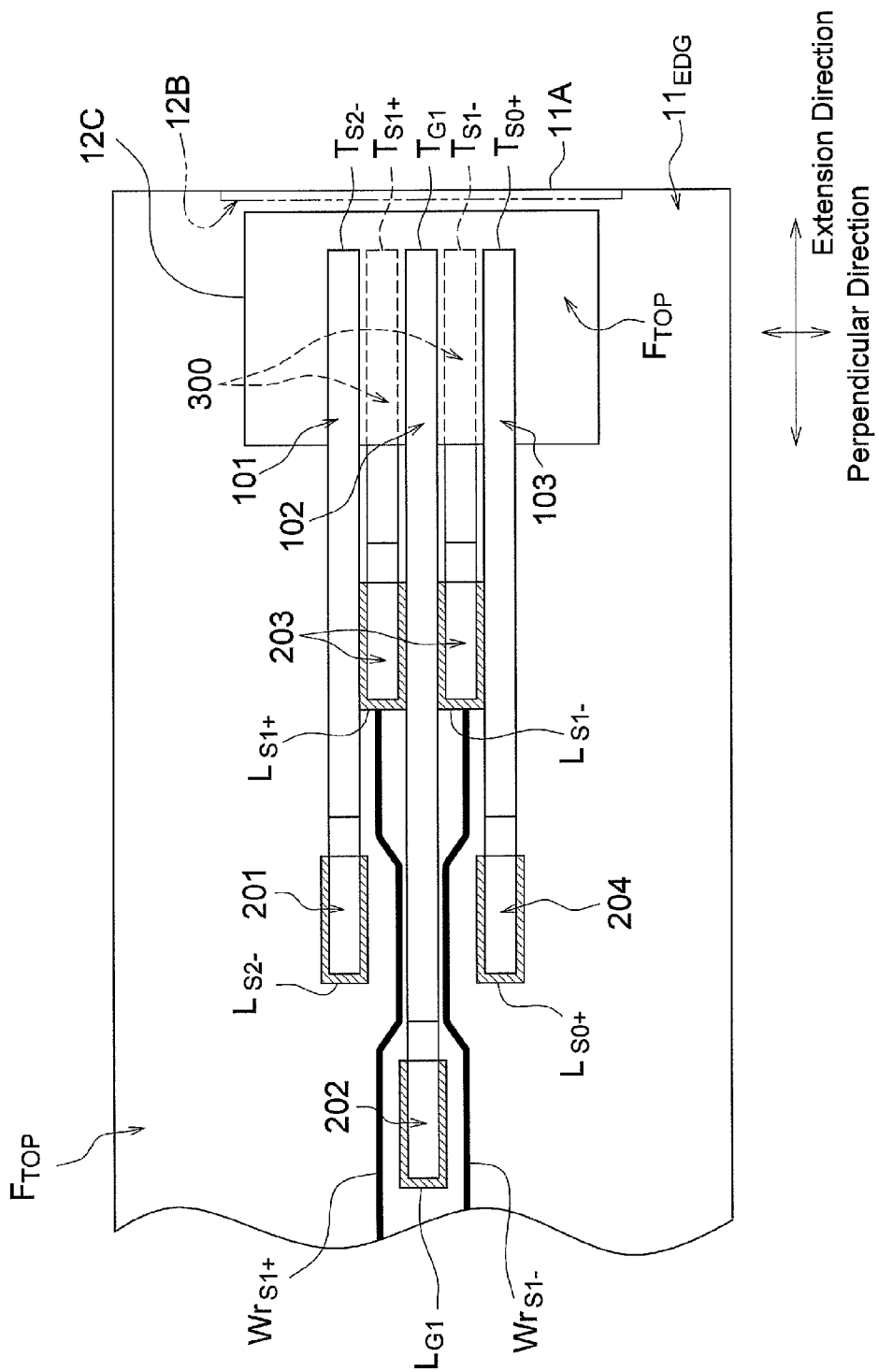
FIG. 6 is a plan view illustrating the terminals, lands, and wires shown in FIG. 5 as viewed from a top face $F_{TOP}$.

Next, the configurations of the terminals, lands, and wires according to the first embodiment will be described with reference to the drawings. FIG. 5 is an enlarged perspective view of FIG. 3. FIG. 6 is a plan view illustrating the terminals, lands, and wires shown in FIG. 5 as viewed from the top face $F_{TOP}$. In FIG. 6, the opening 12B of the receptacle 12 is indicated by the double-dot-dash line.

1. Terminal Configuration

The multiple top terminals $T_{TOP}$ include the signal terminal $T_{S2-}$, the ground terminal $T_{G1}$, and the signal terminal $T_{S0+}$. The multiple bottom terminals $T_{BTM}$ include the pair of signal terminals $T_{S1+}$ and $T_{S1-}$.

The signal terminal $T_{S2-}$ is connected to the top face $F_{TOP}$ of the terminal insulating board 12C and the signal terminal land $L_{S2-}$. Specifically, the signal terminal $T_{S2-}$ has a first top face connection portion 101 connected to the top face $F_{TOP}$ and a first portion 201 connected to the signal terminal land $L_{S2-}$.

The ground terminal $T_{G1}$ is connected to the top face $F_{TOP}$ of the terminal insulating board 12C and the ground terminal land $L_{G1}$. Specifically, the ground terminal $T_{G1}$ has a second top face connection portion 102 connected to the top face $F_{TOP}$ and a second portion 202 connected to the ground terminal land $L_{G1}$. The second top face connection portion 102 is provided adjacent to the first top face connection portion 101 in the perpendicular direction.

The pair of signal terminals $T_{S1+}$ and $T_{S1-}$ is connected to the bottom face $F_{BTM}$ of the terminal insulating board 12C and the pair of signal terminal lands $L_{S1+}$ and $L_{S1-}$. Specifically, the pair of signal terminals $T_{S1+}$ and $T_{S1-}$ has a pair of bottom face connection portions 300 and 300 connected to the bottom face $F_{BTM}$ and a pair of third portions 203 and 203 connected to the pair of signal terminal lands $L_{S1+}$ and $L_{S1-}$.

The signal terminal $T_{S0+}$ is connected to the top face $F_{TOP}$ of the terminal insulating board 12C and the signal terminal land $L_{S0+}$. Specifically, the signal terminal $T_{S0+}$ has a third top face connection portion 103 connected to the top face $T_{TOP}$ and a fourth portion 204 connected to the signal terminal land $L_{S0+}$. The third top face connection portion 103 is provided adjacent to the second top face connection portion 102 in the perpendicular direction. The third top face connection portion 103 is provided opposite to the first top face connection portion 101 with the second top face connection portion 102 therebetween.

Here, the second portion 202 is distanced in the extension direction from the first portion 201. The pair of third portions 203 and 203 is also distanced in the extension direction from the first portion 201.

Specifically, the second portion 202 is distanced from the opening 12B in the extension direction further than the first portion 201. The pair of third portions 203 and 203 is closer to the opening 12B in the extension direction than the first portion 201. The second portion 202 is distanced from the opening 12B further than the pair of third portions 203 and 203.

2. Land Configuration

The multiple forward-row lands Lf include the signal terminal land $L_{S2-}$ and the signal terminal land $L_{S0+}$. The multiple forwardmost-row lands Lm include the ground terminal land $L_{G1}$. The multiple rear-row lands Lr include the pair of signal terminal lands $L_{S1+}$ and $L_{S1-}$.

Here, the ground terminal land $L_{G1}$ is distanced in the extension direction from the signal terminal land $L_{S2-}$. The pair of signal terminal lands $L_{S1+}$ and $L_{S1-}$ is distanced in the extension direction from the signal terminal land $L_{S2-}$.

Specifically, the ground terminal land $L_{G1}$ is distanced from the edge portion $11_{EDG}$ of the main substrate 11A in the extension direction further than the signal terminal land $L_{S2-}$. The pair of signal terminal lands $L_{S1+}$ and $L_{S1-}$ is closer to the edge portion $11_{EDG}$ in the extension direction than the signal terminal land $L_{S2-}$. The ground terminal land $L_{G1}$ is distanced from the edge portion $11_{EDG}$ further than the pair of signal terminal lands $L_{S1+}$ and $L_{S1-}$. The signal terminal land $L_{S0+}$ is provided at approximately the same location in the extension direction as the signal terminal land $L_{S2-}$.

Meanwhile, the signal terminal land $L_{S1+}$ is provided between the signal terminal land $L_{S2-}$ and the ground terminal land $L_{G1}$ in the perpendicular direction. The signal terminal land $L_{S1-}$ is provided between the ground terminal land $L_{G1}$ and the signal terminal land $L_{S0+}$ in the perpendicular direction. The signal terminal land $L_{S0+}$ is provided opposite to the signal terminal land $L_{S2-}$ in the perpendicular direction with the ground terminal land $L_{G1}$ therebetween.

3. Wire Configuration

A pair of rearward wires $Wr_{S1+}$ and $Wr_{S1-}$ extending from the pair of signal terminal lands $L_{S1+}$ and $L_{S1-}$ is provided between the signal terminal land $L_{S2-}$ and the signal terminal land $L_{S0+}$. The wires in the pair of rearward wires $Wr_{S1+}$ and $Wr_{S1-}$ are disposed on either side of the ground terminal land $L_{G1}$ in the perpendicular direction.

4. Other

The relationship between the signal terminal $T_{S0-}$, the ground terminal $T_{GC}$, and the signal terminal $T_{SC+}$ is the same as the relationship between the signal terminal $T_{S2-}$, the ground terminal $T_{G1}$, and the signal terminal $T_{S0+}$.

Likewise, the relationship between the signal terminal land $L_{S0-}$, the ground terminal land $L_{GC}$, and the signal terminal land $L_{SC+}$ is the same as the relationship between the signal terminal land $L_{S2-}$, the ground terminal land $L_{G1}$, and the signal terminal land $L_{S0+}$ mentioned earlier.

(Actions and Effects)

(1) The receptacle 12 according to the first embodiment includes the signal terminal $T_{S2-}$ (a first top terminal), the ground terminal $T_{G1}$ (a second top terminal), and the signal terminal $T_{S1+}$ (a bottom terminal). The second portion 202 of the ground terminal $T_{G1}$ (a second portion) is distanced in the extension direction from the first portion 201 of the signal terminal $T_{S2-}$ (a first portion). The third portion 203 of the signal terminal $T_{S1+}$ (a third portion) is distanced in the extension direction from the first portion 201 of the signal terminal $T_{S2-}$.

In this manner, the first portion 201 is provided at a different location in the extension direction than the second portion 202 and the third portion 203, and thus the signal terminal land $L_{S2-}$ is provided in a different location in the extension direction than the ground terminal land $L_{G1}$ and the signal terminal land $L_{S1+}$. For this reason, the rearward wires Wr can be formed with sufficient clearance on the sides of the signal terminal land $L_{S2-}$. Accordingly, it is not necessary to employ a printed wiring board in which fine wiring patterns can be formed at high densities. As a result, an increase in the cost of manufacturing the printed wiring board 11 can be suppressed.

(2) In the receptacle 12 according to the first embodiment, the second portion 202 is distanced from the opening 12B in the extension direction further than the third portion 203.

For this reason, the ground terminal $T_{G1}$, which is included in the multiple top terminals $T_{TOP}$, is connected to the printed wiring board 12 at a distance further from the opening 12B than the signal terminal $T_{S1+}$ included in the multiple bottom terminals $T_{BTM}$. Accordingly, it is not necessary to invert the vertical positions of the ground terminal $T_{G1}$ and the signal terminal $T_{S1+}$, and thus the terminal structure can be simplified.

(3) In the receptacle 12 according to the first embodiment, the second portion 202 is distanced from the opening 12B further than the first portion 201 in the extension direction, and the third portion 203 is closer to the opening 12B than the first portion 201.

For this reason, the configurations of all of the multiple bottom terminals $T_{BTM}$ can be made the same, and thus the terminal structure can be simplified. In addition, the wire formation area of the first portion 201 on the side toward the edge portion $11_{EDG}$ can be reduced more than in the case where the second portion 202 is provided closer to the opening 12B than the first portion 201.

(4) The receptacle 12 according to the first embodiment includes the signal terminal $T_{S0+}$ (a third top terminal). The fourth portion 204 of the signal terminal $T_{S0+}$ (a fourth portion) is provided at approximately the same position in the extension direction as the first portion 201. The third portion 203 of the signal terminal $T_{S1+}$ is closer to the opening 12B in the extension direction than the first portion.

For this reason, the rearward wire $Wr_{S1+}$, which extends from the signal terminal land $L_{S1+}$ to which the third portion 203 is connected, can be disposed between the signal terminal land $L_{S2-}$ to which the first portion 201 is connected and the signal terminal land $L_{S0+}$ to which the fourth portion 204 is connected. Accordingly, it is not necessary to employ a printed wiring board in which fine wiring patterns can be formed at high densities, and thus an increase in the cost of manufacturing the printed wiring board 11 can be suppressed.

(5) The printed wiring board 11 according to the first embodiment includes the signal terminal land $L_{S2-}$, the ground terminal land $L_{G1}$, and the signal terminal land $L_{S1+}$. The ground terminal land $L_{G1}$ is distanced in the extension direction from the signal terminal land $L_{S2-}$. The signal terminal land $L_{S1+}$ is distanced in the extension direction from the signal terminal land $L_{S2-}$.

In this manner, the signal terminal land $L_{S2-}$ is provided at a different location than the ground terminal land $L_{G1}$ and the signal terminal land $L_{S1+}$ in the extension direction, and thus the rearward wires Wr can be formed with sufficient clearance on the sides of the signal terminal land $L_{S2-}$. Accordingly, it is not necessary to employ a printed wiring board in which fine wiring patterns can be formed at high densities. As a result, an increase in the cost of manufacturing the printed wiring board 11 can be suppressed.

(6) The ground terminal land $L_{G1}$ is distanced from the edge portion $11_{EDG}$ of the main substrate 11A in the extension direction further than the signal terminal land $L_{S1+}$.

For this reason, it is not necessary to invert the vertical positions of the ground terminal $T_{G1}$ and the signal terminal $T_{S1+}$, and thus the terminal structure can be simplified.

(7) The ground terminal land $L_{G1}$ is further from the edge portion $11_{EDG}$ in the extension direction than the signal terminal land $L_{S2-}$, and the signal terminal land $L_{S1+}$ is closer to the edge portion $11_{EDG}$ in the extension direction than the signal terminal land $L_{S2-}$.

For this reason, the configurations of all of the multiple bottom terminals $T_{BTM}$ can be made the same, and thus the terminal structure can be simplified. In addition, the wire formation area of the signal terminal land $L_{S2-}$ on the side toward the edge portion $11_{EDG}$ can be reduced more than in the case where the ground terminal land $L_{G1}$ is provided closer to the edge portion $11_{EDG}$ than the signal terminal land $L_{S2-}$.

(8) The printed wiring board 11 according to the first embodiment includes the signal terminal land $L_{S0+}$. The signal terminal land $L_{S0+}$ is provided at approximately the same location in the extension direction as the signal terminal land $L_{S2-}$. The signal terminal land $L_{S1+}$ is closer to the edge portion $11_{EDG}$ in the extension direction than the signal terminal land $L_{S2-}$.

For this reason the rearward wire $Wr_{S1+}$ that extends from the signal terminal land $L_{S1+}$ can be disposed between the signal terminal land $L_{S2-}$ and the signal terminal land $L_{S0+}$. Accordingly, it is not necessary to employ a printed wiring board in which fine wiring patterns can be formed at high densities, and thus an increase in the cost of manufacturing the printed wiring board 11 can be suppressed.

Second Embodiment

Next, the configuration of a printed wiring board 11 and a receptacle 12 according to a second embodiment will be described with reference to the drawings. Hereinafter, the differences from the first embodiment will mainly be described. The difference from the first embodiment is that the printed wiring board 11 includes multiple rearwardmost-row lands Ln instead of the multiple forwardmost-row lands Lm.

(Receptacle Configuration)

Figure 7:
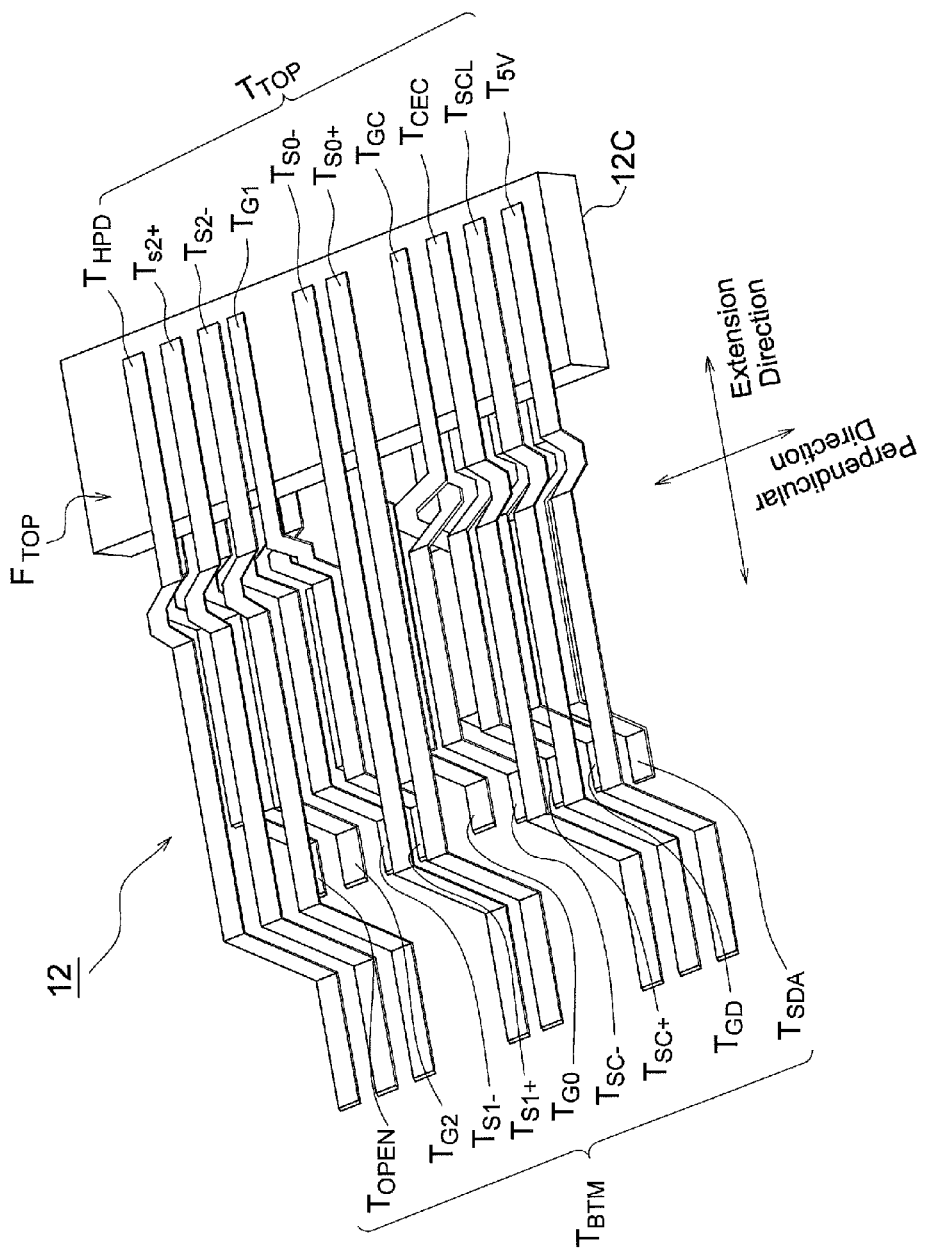
FIG. 7 is a perspective view illustrating the internal configuration of a receptacle 12 according to a second embodiment.

First, the configuration of the receptacle according to the second embodiment will be described with reference to the drawings. FIG. 7 is a perspective view illustrating the internal configuration of the receptacle 12 according to the second embodiment. The housing 12A has been omitted from FIG. 7.

In the present embodiment, the ground terminal $T_{G1}$ and the ground terminal $T_{GC}$ are formed so as to be shorter in the extension direction than the other top terminals $T_{TOP}$.

Meanwhile, the vertical positions of the ground terminal $T_{G1}$ and the pair of signal terminals $T_{S1-}$ and $T_{S1+}$ are inverted. The vertical positions of the ground terminal $T_{GC}$ and the pair of signal terminals $T_{SC-}$ and $T_{SC+}$ are inverted.

(Printed Wiring Board Configuration)

Figure 8:
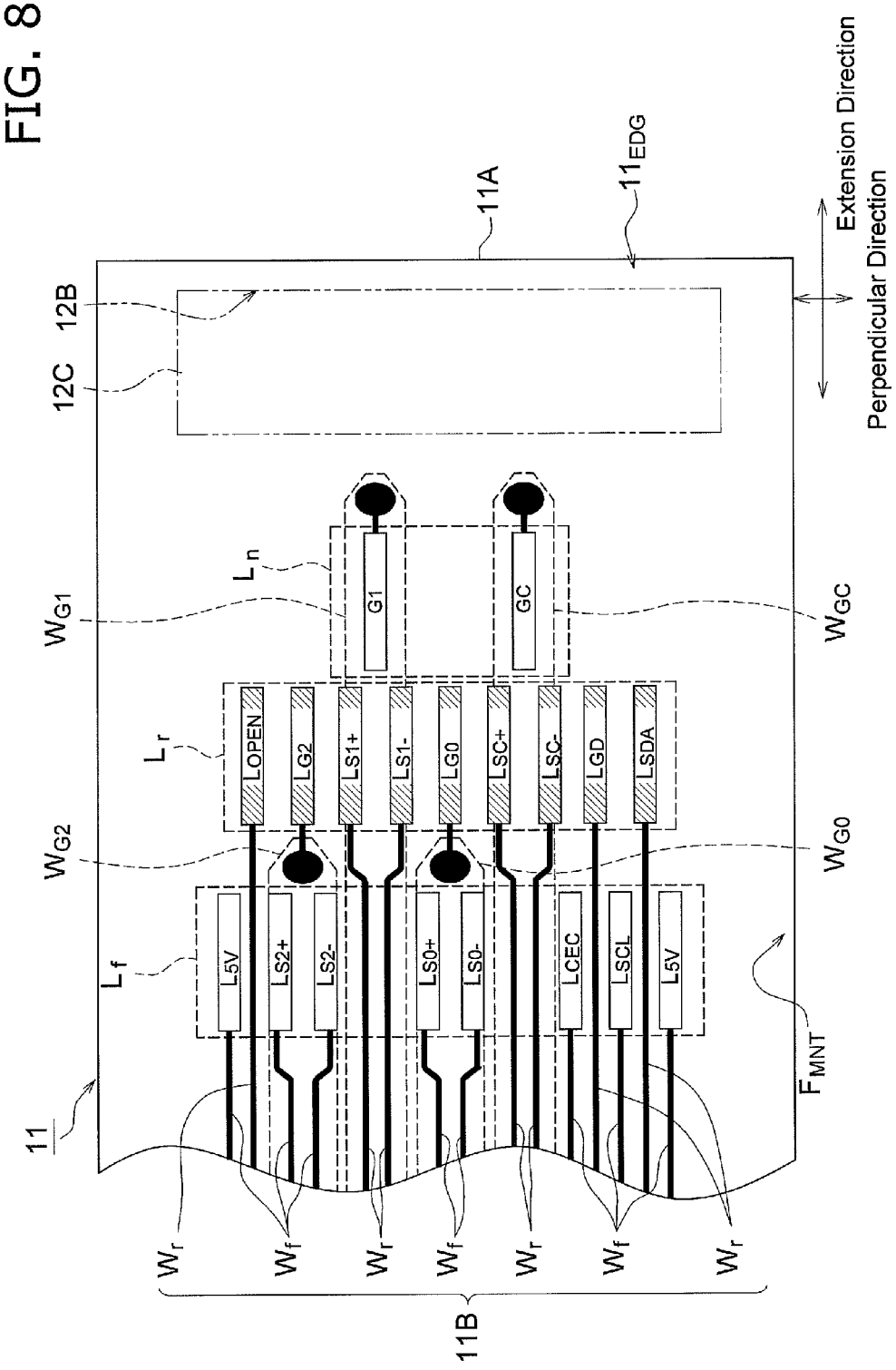
FIG. 8 is a plan view illustrating a printed wiring board 11 according to the second embodiment as viewed from a mounting face $F_{MNT}$.

Next, the configuration of the printed wiring board according to the second embodiment will be described with reference to the drawings. FIG. 8 is a plan view illustrating the printed wiring board 11 according to the second embodiment as viewed from the mounting face $F_{MNT}$. Note that in FIG. 8, the locations of the opening 12B and the terminal insulating board 12C of the receptacle 12 are indicated by the double-dot-dash lines.

In the present embodiment, the wire group 11B includes the multiple rearwardmost-row lands Ln.

The multiple rearwardmost-row lands Ln are metal members for connecting the ground terminal $T_{G1}$ and the ground terminal $T_{GC}$ of the multiple top terminals $T_{TOP}$. The multiple rearwardmost-row lands Ln are, as shown in FIG. 8, provided closer to the edge portion $11_{EDG}$ of the main substrate 11A in the extension direction than the multiple rear-row lands Lr. To rephrase, the multiple rearwardmost-row lands Ln are closer to the opening 12B of the receptacle 12 than the multiple rear-row lands Lr when viewed from above the mounting face $F_{MNT}$.

(Terminal, Land, and Wire Configuration)

Figure 9:
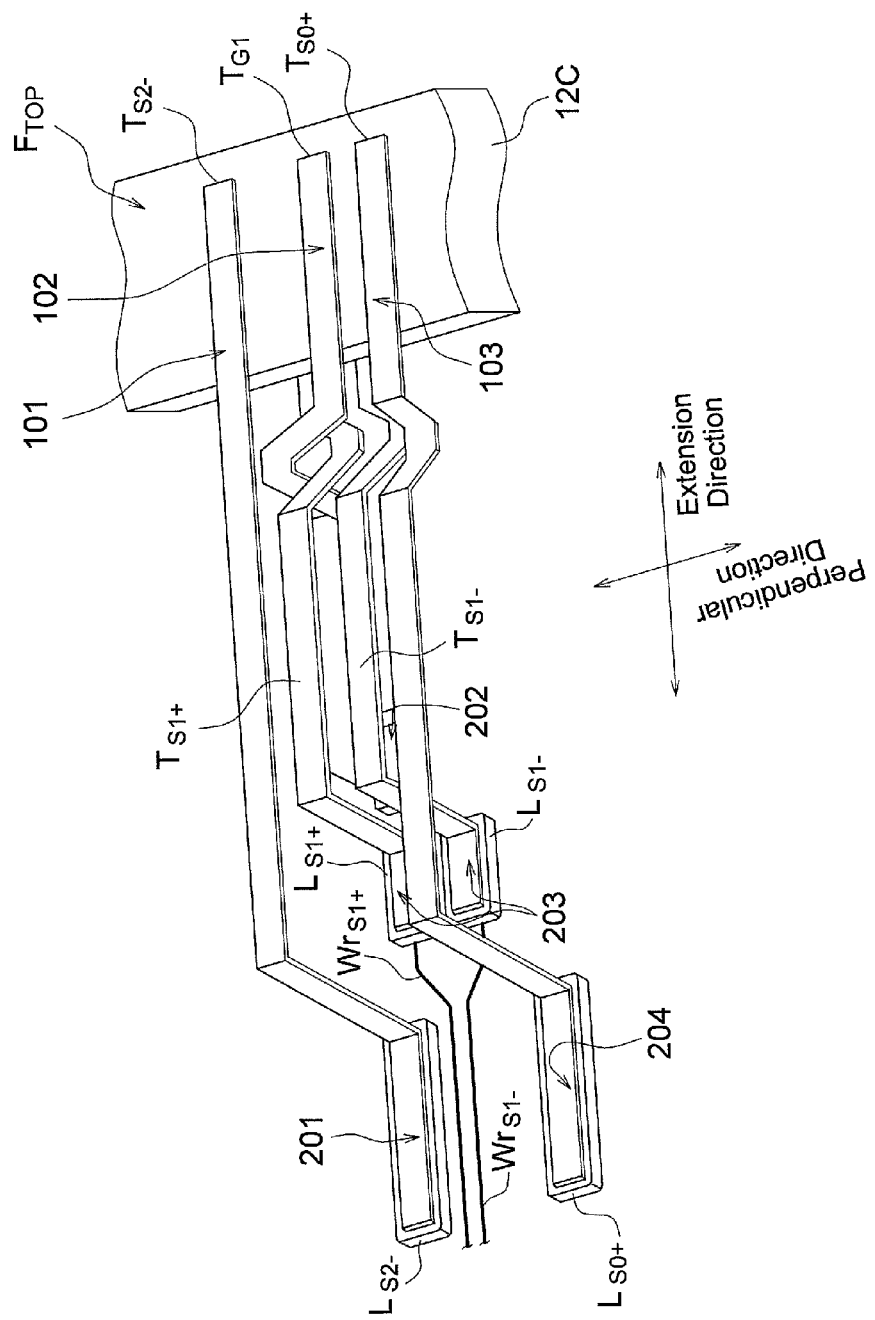
FIG. 9 is an enlarged perspective view of FIG. 7.

Next, the configurations of the terminals, lands, and wires according to the second embodiment will be described with reference to the drawings. FIG. 9 is an enlarged perspective view of FIG. 7.

1. Terminal Configuration

As shown in FIG. 9, the second portion 202 of the ground terminal $T_{G1}$ is closer to the opening 12B (not shown in FIG. 9) in the extension direction than the pair of third portions 203 and 203 of the pair of signal terminals $T_{S1+}$ and $T_{S1-}$. The pair of third portions 203 and 203 is closer to the opening 12B in the extension direction than the first portion 201 of the signal terminal land $L_{S2-}$.

Note that in the present embodiment, the ground terminal $T_{G1}$ is disposed passing alongside the pair of signal terminals $T_{S1-}$ and $T_{S1+}$ and below the pair of signal terminals $T_{S1-}$ and $T_{S1+}$. As a result, the vertical positions of the ground terminal $T_{G1}$ and the pair of signal terminals $T_{S1-}$ and $T_{S1+}$ are inverted.

2. Land Configuration

As shown in FIG. 9, the ground terminal land $L_{G1}$ is closer to the opening 12B (not shown in FIG. 9) in the extension direction than the pair of signal terminal lands $L_{S1+}$ and $L_{S1-}$. The pair of signal terminal lands $L_{S1+}$ and $L_{S1-}$ is closer in the extension direction to the opening 12B than the signal terminal land $L_{S2-}$.

3. Wire Configuration

The pair of rearward wires $Wr_{S1+}$ and $Wr_{S1-}$ extending from the pair of signal terminal lands $L_{S1+}$ and $L_{S1-}$ is provided between the signal terminal land $L_{S2-}$ and the signal terminal land $L_{S0+}$.

4. Other

The relationship between the signal terminal $T_{S0-}$, the ground terminal $T_{GC}$, and the signal terminal $T_{SC+}$ is the same as the relationship between the signal terminal $T_{S2-}$, the ground terminal $T_{G1}$, and the signal terminal $T_{S0+}$.

Likewise, the relationship between the signal terminal land $L_{S0-}$, the ground terminal land $L_{GC}$, and the signal terminal land $L_{SC+}$ is the same as the relationship between the signal terminal land $L_{S2-}$, the ground terminal land $L_{G1}$, and the signal terminal land $L_{S0+}$ mentioned earlier.

(Actions and Effects)

(1) The receptacle 12 according to the second embodiment includes the signal terminal $T_{S2-}$ (a first top terminal), the ground terminal $T_{G1}$ (a second top terminal), and the signal terminal $T_{S1+}$ (a bottom terminal). The second portion 202 of the ground terminal $T_{G1}$ is distanced in the extension direction from the first portion 201 of the signal terminal $T_{S2-}$. The third portion 203 of the signal terminal $T_{S1+}$ is distanced in the extension direction from the first portion 201 of the signal terminal $T_{S2-}$.

Accordingly, as with the aforementioned first embodiment, an increase in the cost of manufacturing the printed wiring board 11 can be suppressed.

(2) In the receptacle 12 according to the second embodiment, the second portion 202 of the ground terminal $T_{G1}$ is closer to the opening 12B in the extension direction than the third portion 203 of the signal terminal $T_{S1+}$. The third portion 203 is closer to the opening 12B in the extension direction than the first portion 201 of the signal terminal land $L_{S2-}$.

Accordingly, the rearward wire $Wr_{S1+}$, which extends from the signal terminal land $L_{S1+}$ to which the third portion 203 is connected, can be disposed between the signal terminal land $L_{S2-}$ to which the first portion 201 is connected and the signal terminal land $L_{S0+}$ to which the fourth portion 204 is connected.

In addition, because it is not necessary to dispose the rearward wire $Wr_{S1+}$ to the side of the ground terminal land $L_{G1}$, the level of freedom of the wiring pattern can be increased.

Third Embodiment

Next, the configuration of a receptacle 12 according to a third embodiment will be described with reference to the drawings. Hereinafter, the differences from the second embodiment will mainly be described. The difference from the second embodiment is that the pair of signal terminals $T_{S1-}$ and $T_{S1+}$ are twisted by approximately 90 degrees.

Hereinafter, the pair of signal terminals $T_{S1-}$ and $T_{S1+}$ will be described as an example. However, it should be noted that this configuration is not limited to the pair of signal terminals $T_{S1-}$ and $T_{S1+}$, and can be applied in the pair of signal terminals $T_{SC-}$ and $T_{SC+}$.

(Terminal Configuration)

Figure 10:
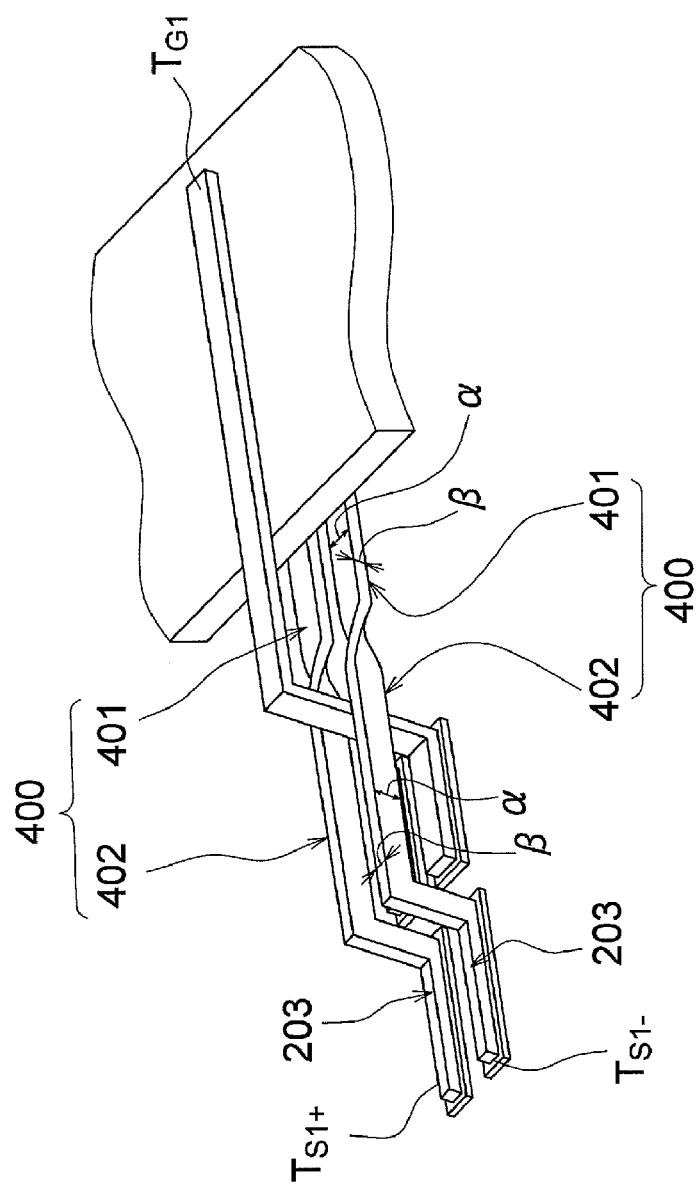
FIG. 10 is an enlarged perspective view illustrating a pair of signal terminals $T_{SC-}$ and $T_{SC+}$ according to a third embodiment.

The configuration of the terminals according to the third embodiment will be described with reference to the drawings. FIG. 10 is an enlarged perspective view illustrating a pair of signal terminals $T_{SC-}$ and $T_{SC+}$ according to the third embodiment.

Each of the terminals in the pair of signal terminals $T_{SC-}$ and $T_{SC+}$ has a link portion 400 that links the bottom face connection portion 300 (see FIG. 6) and the third portion 203. Each of the terminals in the pair of signal terminals $T_{SC-}$ and $T_{SC+}$ is twisted by approximately 90 degrees at the link portion 400. Accordingly, a wide portion 401 and a narrow portion 402 are formed in the link portion 400.

The wide portion 401 connects to the bottom face connection portion 300. The wide portion 401 extends from the bottom face connection portion 300 to the outer side of the bottom face $F_{BTM}$. The narrow portion 402 connects to the wide portion 401. The narrow portion 402 extends from the wide portion 401 toward a third connection portion 203.

Here, the wide portion 401 and the narrow portion 402 are formed by twisting plate-shaped metallic pieces by approximately 90 degrees. Accordingly, a width $\alpha$ of the wide portion 401 is equal to a thickness $\alpha$ of the narrow portion 402. Likewise, a thickness $\beta$ ($<\alpha$) of the wide portion 401 is equal to a width $\beta$ of the narrow portion 402. Accordingly, when viewed from the top face $F_{TOP}$, the width $\beta$ of the narrow portion 402 is narrower than the width $\alpha$ of the wide portion 401.

The ground terminal $T_{G1}$ is disposed adjacent to the narrow portion 402. As a result, the vertical positions of the pair of signal terminals $T_{S1+}$ and $T_{S1-}$ and the ground terminal $T_{G1}$ are inverted.

(Actions and Effects)

(1) In the receptacle 12 according to the third embodiment, the signal terminal $T_{S1+}$ (a bottom terminal) includes the wide portion 401 and the narrow portion 402. When viewed from the top face $F_{TOP}$, the width $\beta$ of the narrow portion 402 is narrower tan the width $\alpha$ of the wide portion 401.

Accordingly, it is easier to secure space for disposing the ground terminal $T_{G1}$ next to the narrow portion 402. As a result, the ground terminal $T_{G1}$ and the signal terminal $T_{S1+}$ can be disposed in a linear manner. Accordingly, it is easier to achieve a more simplified terminal structure.

Fourth Embodiment

Next, the configuration of a receptacle 12 according to a fourth embodiment will be described with reference to the drawings. Hereinafter, the differences from the second embodiment will mainly be described. The difference from the second embodiment is that the vertical positions of the ground terminal $T_{G1}$ and the signal terminal $T_{S1+}$ are inverted within the terminal insulating board 12C.

(Receptacle Configuration)

Figure 11:
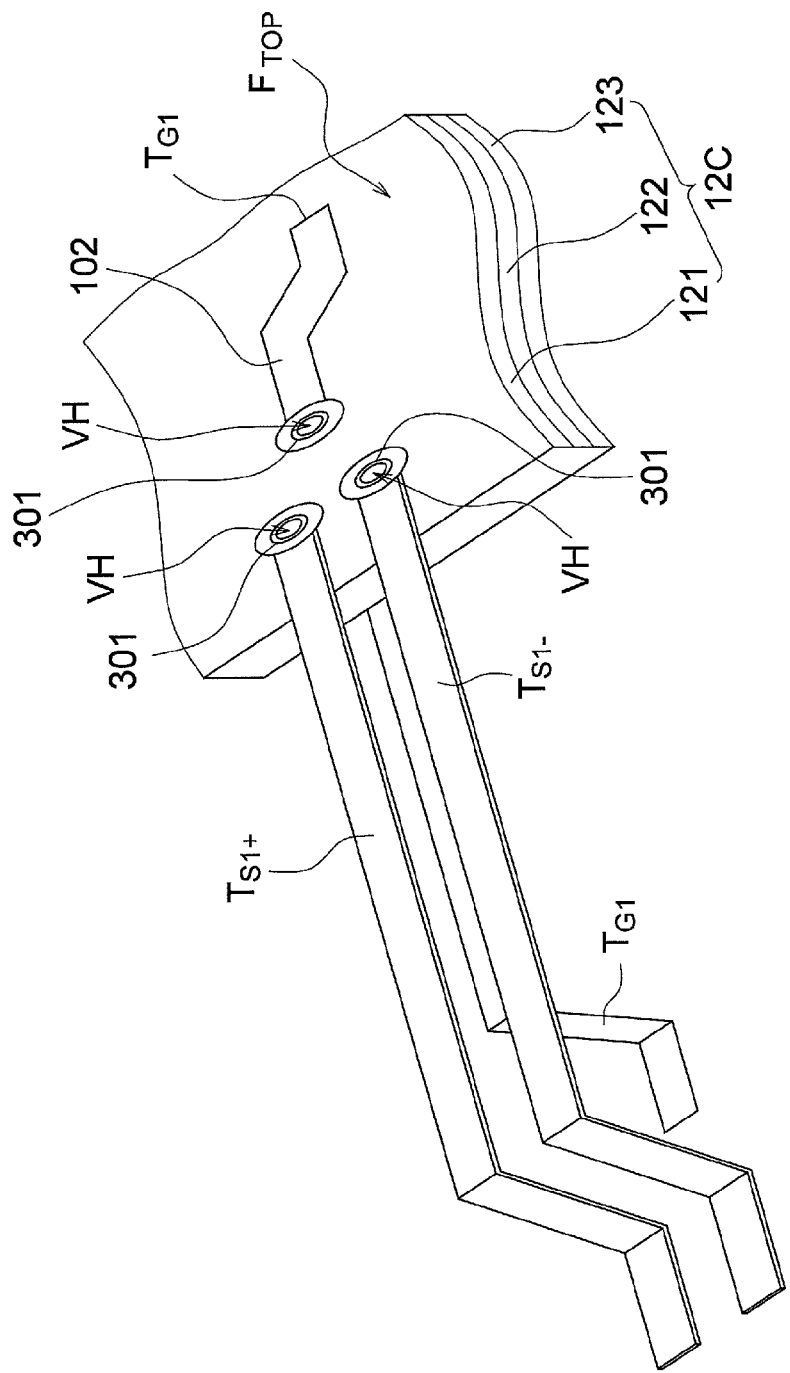
FIG. 11 is a perspective view illustrating a ground terminal $T_{G1}$ and a pair of signal terminals $T_{S1+}$ and $T_{S1-}$ according to a fourth embodiment.

The configuration of the receptacle 12 according to the fourth embodiment will be described with reference to the drawings. FIG. 11 is a perspective view illustrating the ground terminal $T_{G1}$ and the pair of signal terminals $T_{S1+}$ and $T_{S1-}$ according to the fourth embodiment.

The terminal insulating board 12C is configured of three substrates that are stacked (a top substrate 121, a middle substrate 122, and a bottom substrate 123). Each of the three substrates has multiple via holes VH formed therein in a predetermined pattern. The inner walls of the multiple via holes VH are plated with a conductive material. As a result, via wires 301 are formed.

Figure 12:
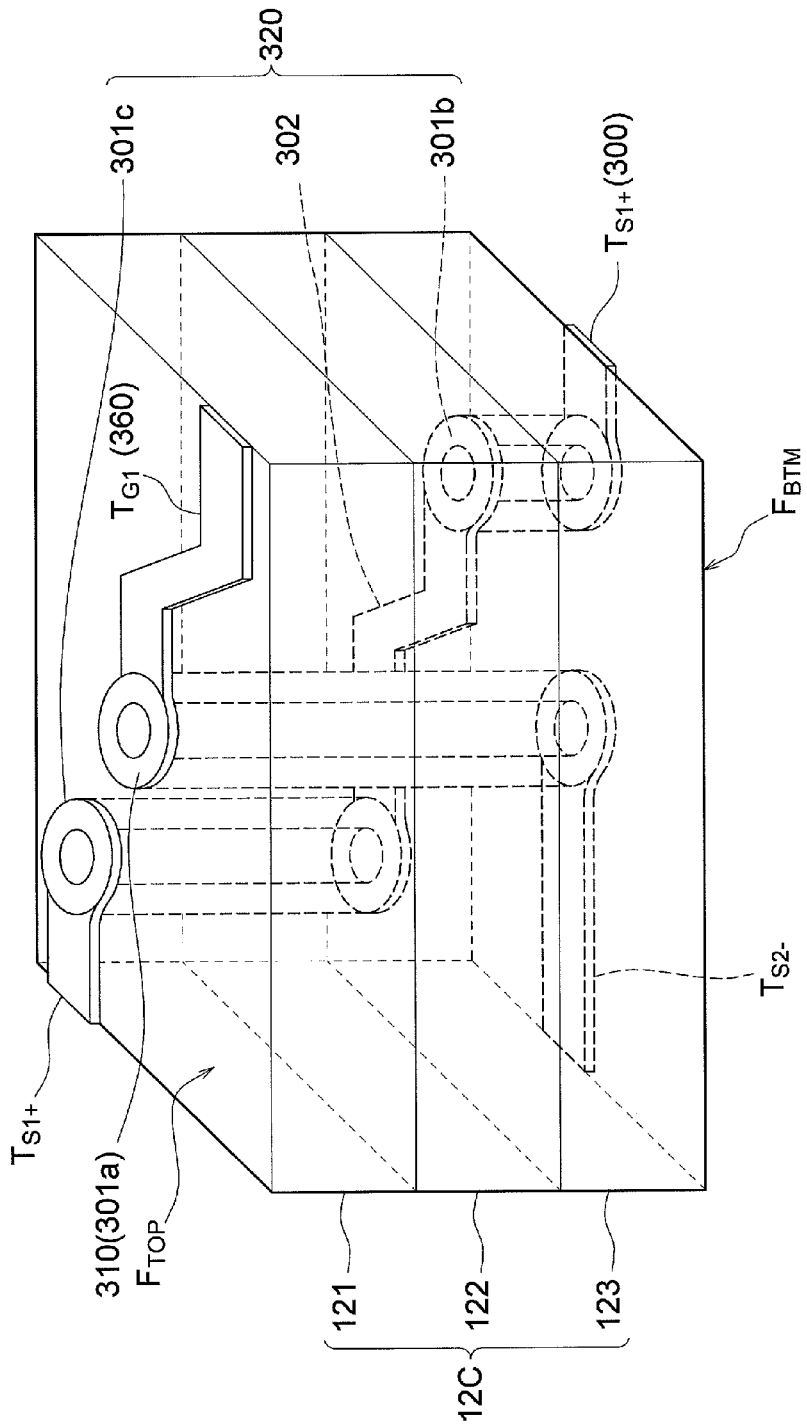
FIG. 12 is a see-through perspective view illustrating a terminal insulating board 12C according to the fourth embodiment.

FIG. 12 is a see-through perspective view illustrating the terminal insulating board 12C according to the fourth embodiment.

The ground terminal $T_{G1}$ includes the second top face connection portion 102 and a first inner layer portion 310. The inner layer portion 310 is connected to the second top face connection portion 102 on the top face $F_{TOP}$. The inner layer portion 310 is inserted into the terminal insulating board 12C from the top face $F_{TOP}$ to the bottom face $F_{BTM}$.

The inner layer portion 310 is configured of a via wire 301a that passes through the top substrate 121, the middle substrate 122, and the bottom substrate 123.

The signal terminal $T_{S2+}$ includes the bottom face connection portion 300 and a second inner layer portion 320. The second inner layer portion 320 is configured of a via wire 301b, a via wire 301c, and an internal wire 302. The via wire 301b is connected to the bottom face connection portion 300 on the bottom face $F_{BTM}$. The via wire 301b passes through the bottom substrate 123. The via wire 301b passes through the top substrate 121 and the middle substrate 122. The internal wire 302 is formed between the middle substrate 122 and the bottom substrate 123. The internal wire 302 connects the via wire 301b and the via wire 301c.

As a result, the vertical positions of the ground terminal $T_{G1}$ and the signal terminal $T_{S1+}$ are inverted within the terminal insulating board 12C.

(Actions and Effects)

In the receptacle 12 according to the fourth embodiment, the signal terminal $T_{S1+}$ includes the inner layer portion 310, and the ground terminal $T_{G1}$ includes the inner layer portion 320.

Accordingly, the vertical positions of the ground terminal $T_{G1}$ and the signal terminal $T_{S1+}$ are inverted within the terminal insulating board 12C, and thus it is not necessary to cause the ground terminal $T_{G1}$ and the signal terminal $T_{S1+}$ to intersect. For this reason, the terminal structure with respect to the ground terminal $T_{G1}$ and the signal terminal $T_{S1+}$ can be further simplified.

Other Embodiments

Although the present invention has been described according to the aforementioned embodiments, it is to be understood that the descriptions and drawings of which this disclosure is made up are not intended to limit the invention. Various alternative embodiments, working examples, and operational techniques should be clear to a person skilled in the art based on this disclosure.

(1) Although the aforementioned embodiments have described the configurations of terminals and lands using the drawings, the present invention is not limited to the descriptions therein. The second portion 202 and the third portion 203 can each be altered in various ways as long as they are distanced from the first portion 201 in the extension direction.

(2) Although the narrow portion 402 is described in the third embodiment as being formed through a twisting process, the formation of the narrow portion 402 is not limited thereto. For example, the narrow portion 402 may be formed through a cutting process or the like as well. Note, however, that it is preferable for the width to gradually decrease in the direction from the wide portion 401 to the narrow portion 402 at the border between the wide portion 401 and the narrow portion 402. Furthermore, it is preferable for the thickness to gradually increase in the direction from the wide portion 401 to the narrow portion 402 at the border between the wide portion 401 and the narrow portion 402.

(3) Although the aforementioned embodiments have described the terminal insulating board 12C as being such that the multiple rear-row lands Lr and the multiple forward-row lands Lf do not overlap when viewed from above, the present invention is not limited thereto. In the terminal insulating board 12C, the multiple rear-row lands Lr and the multiple forward-row lands Lf may overlap when viewed from above.

(4) Although the aforementioned embodiments have described an interface based on the HDMI standard as an example of an interface between electronic devices, the present invention is not limited to this interface. For example, a serial interface based on a standard such as USB (Universal Serial Bus), DVI (Digital Visual Interface)®, or IEEE (Institute of Electrical and Electronic Engineers) 1394 can be used as the interface between the electronic devices.

(5) Although the aforementioned embodiments have described the signal terminals $T_S$ as transmitting signals according to a quasi-differential transmission system based on TMDS or the like, the present invention is not limited thereto. For example, the signal terminals $T_S$ may transmit signals according to a differential transmission system based on the USB standard.

(6) Although not particularly discussed in the aforementioned embodiments, the widths of the signal terminals $T_S$, the widths of the ground terminals $T_G$, and the distances between the signal terminals $T_S$ and the ground terminals $T_G$ can be set as appropriate. Doing so makes it possible to adjust the characteristic impedance of the lines.

Thus it goes without saying that the present invention includes various other embodiments not described here. Accordingly, the technical scope of the present invention is to be defined only by the invention-defining matters according to the scope of claims pursuant to the above descriptions.

Industrial Applicability

According to the receptacle, printed wiring board, and electronic device of the present embodiment, an increase in the cost of manufacturing the printed wiring board can be suppressed, and thus the present invention is useful in the field of electronic devices.

What is claimed is:

1. A receptacle comprising:
a housing member configured to be mounted on a printed wiring board, the housing member defining an opening into which a plug is inserted;
a terminal insulating board including a top face and a bottom face opposite to the top face, the terminal insulating board being disposed inside the housing member with the bottom face facing the printed wiring board;
a first top terminal including a first top face connection portion connected to the top face and a first portion connected to the printed wiring board, the first top terminal being disposed along a predetermined direction when viewed from above the top face;
a second top terminal including a second top face connection portion connected to the top face at a distance from the first top face connection portion and a second portion connected to the printed wiring board at a distance from the first portion in the predetermined direction;
a third top terminal including a third top face connection portion connected to the top face of the terminal insulating board on the opposite side of the first top face connection portion of the first top terminal with the second top face connection portion of the second top terminal disposed therein between and a fourth portion connected to the printed wiring board at approximately the same location in the predetermined direction as the first portion; and
a bottom terminal including a bottom face connection portion connected to the bottom face on the opposite side of the first top face connection portion and the second top face connection portion and a third portion connected to the printed wiring board a distance from the first portion in the predetermined direction.

2. The receptacle according to claim 1, wherein the second portion is further from the opening in the predetermined direction than the third portion.

3. The receptacle according to claim 2, wherein the second portion is further from the opening in the predetermined direction than the first portion; and the third portion is closer to the opening in the predetermined direction than the first portion.

4. The receptacle according to claim 1, wherein
the third portion is further from the opening than the second portion and closer to the opening than the first portion in the predetermined direction.

5. The receptacle according to claim 4, wherein
the bottom terminal further includes a wide portion disposed between and connecting a narrow portion and the bottom face connection portion, the width of the narrow portion being smaller than the width of the wide portion, the second top terminal being disposed lateral to the narrow portion.

6. The receptacle according to claim 4, wherein
the bottom terminal further includes a first inner layer portion connected to the bottom face connection portion on the bottom face of the terminal insulating board, the first inner layer portion passing through the terminal insulating board from the bottom face to the top face; and
the second top terminal further includes a second inner layer portion connected to the second top face connection portion on the top face of the terminal insulating board, the second inner layer portion passing through the terminal insulating board from the top face to the bottom face.

7. The receptacle according to claim 6, wherein
the terminal insulating board is a stack of substrates formed of at least one substrate, and each of the first inner layer portion and the second inner layer portion includes a via wire inserted into the stack of substrates.

8. The receptacle according to claim 1, wherein
the bottom terminal is a signal terminal, and the third portion is closer to the opening in the predetermined direction than the first portion.

9. A printed wiring board comprising:
a main substrate having a mounting face configured to support a receptacle with a signal terminal and a ground terminal;
a first land mounted on the mounting face along a predetermined direction;
a second land mounted on the mounting face at a distance from the first land along the predetermined direction and configured to be connected to the ground terminal;
a third land mounted on the mounting face at a distance from the first land along the predetermined direction, the third land being disposed between the first land and the second land along a transverse direction relative to the predetermined direction and configured to be connected to the signal terminal; and
a fourth land mounted on the mounting face and disposed substantially in the same location in the predetermined direction as the first land, the second land being disposed between the first land and the fourth land in the transverse direction, the third land being disposed closer to an edge portion of the main substrate in the predetermined direction than the first land and configured to be connected to the signal terminal.

10. The printed wiring board according to claim 9, wherein
the second land is positioned further from an edge portion of the main substrate in the predetermined direction than the first land; and
the third land is positioned closer to the edge portion in the predetermined direction than the first land.

11. An electronic device comprising:
a receptacle including
a housing member mounted on a printed wiring board, the housing member defining including an opening into which a plug is inserted,
a terminal insulating board having a top face and a bottom face opposite to the top face, the terminal insulating board being disposed inside the housing member with the bottom face facing the printed wiring board,
a first top terminal having a first top face connection portion connected to the top face and a first portion connected to the printed wiring board, the first top terminal being disposed along a predetermined direction when viewed from above the top face,
a second top terminal having a second top face connection portion connected to the top face at a distance from the first top face connection portion and a second portion connected to the printed wiring board at a distance from the first portion in the predetermined direction,
a third top terminal including a third top face connection portion connected to the top face of the terminal insulating board on the opposite side of the first top face connection portion of the first top terminal with the second top face connection portion of the second top terminal disposed therein between and a fourth portion connected to the printed wiring board at approximately the same location in the predetermined direction as the first portion, and
a bottom terminal having a bottom face connection portion connected to the bottom face on the opposite side of the first top face connection portion and the second top face connection portion and a third portion connected to the printed wiring board at a distance from the first portion in the predetermined direction; and
a printed wiring board including
a main substrate having a mounting face that supports the receptacle,
a first land mounted on the mounting face and connected to the first portion of the first top terminal,
a second land mounted on the mounting face and connected to the second portion of the second top terminal,
a third land mounted on the mounting face and connected to the third portion of the bottom terminal, and
a fourth land mounted on the mounting face and disposed substantially in the same location in the predetermined direction as the first land, the second land being disposed between the first land and the fourth land in the transverse direction, the third land being disposed closer to an edge portion of the main substrate in the predetermined direction than the first land and configured to be connected to the signal terminal.

* * * * *